US011496107B2

United States Patent
Jo et al.

(10) Patent No.: US 11,496,107 B2
(45) Date of Patent: Nov. 8, 2022

(54) FRONTEND MODULE

(71) Applicant: SAMSUNG ELECTRO-MECHANICS CO., LTD., Suwon-si (KR)

(72) Inventors: Kang Ta Jo, Suwon-si (KR); Seong Jong Cheon, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/246,993

(22) Filed: May 3, 2021

(65) Prior Publication Data

US 2021/0257985 A1 Aug. 19, 2021

Related U.S. Application Data

(63) Continuation of application No. 16/670,770, filed on Oct. 31, 2019, now Pat. No. 11,025,218.

(30) Foreign Application Priority Data

Apr. 10, 2019 (KR) .................. 10-2019-0042091
Jun. 26, 2019 (KR) .................. 10-2019-0076502

(51) Int. Cl.
*H03H 7/01* (2006.01)
*H03H 9/54* (2006.01)
*H03H 7/46* (2006.01)

(52) U.S. Cl.
CPC ........ *H03H 7/1775* (2013.01); *H03H 7/0115* (2013.01); *H03H 7/0161* (2013.01); *H03H 7/461* (2013.01); *H03H 9/542* (2013.01)

(58) Field of Classification Search
CPC .... H03H 7/0115; H03H 7/0161; H03H 9/542; H03H 7/46; H03H 7/1775
(Continued)

(56) References Cited

U.S. PATENT DOCUMENTS 9,935,603 B2   4/2018   Imamura
10,110,192 B2  10/2018  Watanabe
(Continued)

FOREIGN PATENT DOCUMENTS

CN   105656445 A   6/2016
CN   109286387 A   1/2019
(Continued)

OTHER PUBLICATIONS

DeTomasi, Sheri. "Coexistence Issues: Coming to 5G New Radio." EDN Asia, Aug. 7, 2018, www.ednasia.com/news/article/Coexistence-issues--Coming-to-5G-New-Radio. (5 pages, in English).
(Continued)

*Primary Examiner* — Rakesh B Patel
(74) *Attorney, Agent, or Firm* — NSIP Law

(57) ABSTRACT

A frontend module includes a first filter having a passband of a first frequency band, a second filter having a passband of a second frequency band, the second frequency band being higher than the first frequency band, a third filter having a passband of a third frequency band, the third frequency band being higher than the second frequency band, and a sub-filter, connected to the second filter, configured to provide attenuation characteristics for the first frequency band, wherein the second filter comprises a plurality of parallel LC resonance circuits arranged between a ground and different nodes, from among a plurality of nodes between a first terminal and a second terminal, wherein an inductor is connected to a portion of the plurality of parallel LC resonance circuits.

19 Claims, 7 Drawing Sheets

(58) Field of Classification Search
USPC .......................................................... 333/175
See application file for complete search history.

(56) References Cited

U.S. PATENT DOCUMENTS

| | | |
|---|---|---|
| 2003/0083034 A1 | 5/2003 | Motoyama |
| 2008/0197941 A1 | 8/2008 | Suzuki et al. |
| 2010/0091752 A1 | 4/2010 | Kemmochi et al. |
| 2016/0156324 A1 | 6/2016 | Watanabe |
| 2016/0294423 A1 | 10/2016 | Yatsenko et al. |
| 2018/0013395 A1 | 1/2018 | Asada |
| 2018/0198433 A1* | 7/2018 | Mori ................ H04B 1/52 |
| 2019/0028085 A1 | 1/2019 | Kato et al. |

FOREIGN PATENT DOCUMENTS

| | | | |
|---|---|---|---|
| JP | 2003-143028 A | 5/2003 | |
| JP | 2008-205947 A | 9/2008 | |
| JP | 6428918 B2 | 11/2018 | |
| KR | 10-2005-0034196 A | 4/2005 | |
| KR | 10-2009-0092779 A | 9/2009 | |
| KR | 10-2014-0064321 A | 5/2014 | |
| KR | 10-2016-0117285 A | 10/2016 | |
| KR | 10-1922574 B1 | 11/2018 | |
| WO | WO 2008/065009 A1 | 6/2008 | |

OTHER PUBLICATIONS

Ludwig, R., et al. Design of RF and Microwave Filters. Sogang University, home.sogang.ac.kr/sites/eemic/lecture/note02/Lists/b10/Attachments/3/5_Design_of_RF_and_Microwave_Filters%20[%ED%98%B8%ED%99%98%20%EB%AA%A8%EB%93%9C].pdf. (45 pages, in English).

Korean Office Action dated Mar. 6, 2020 in counterpart Korean Patent Application No. 10-2019-0076502 (7 pages in English and 5 pages in Korean).

Chinese Office Action dated Oct. 9, 2021 in corresponding Chinese Patent Application No. 201911355080.1 (7 pages in English and 6 pages in Chinese).

Chinese Office Action dated Jun. 15, 2021, and the accompanying Search Report dated Jun. 4, 2021, in counterpart Chinese Patent Application No. 201911355080.1 (8 pages in English and 8 pages in Chinese).

Chinese Office Action dated Feb. 11, 2022 in corresponding Chinese Patent Application No. 201911355080.1 (4 pages in English and 4 pages in Chinese).

* cited by examiner

FRONTEND MODULE

CROSS-REFERENCE TO RELATED APPLICATIONS

This application is a continuation of application Ser. No. 16/670,770 filed on Oct. 31, 2019, which claims the benefit under 35 U.S.C. § 119(a) of Korean Patent Application No. 10-2019-0042091 filed on Apr. 10, 2019 and Korean Patent Application No. 10-2019-0076502 filed on Jun. 26, 2019, in the Korean Intellectual Property Office, the entire disclosures of which are incorporated herein by reference for all purposes.

BACKGROUND

1. Field

The present disclosure relates to a frontend module.

2. Description of Related Art

Fifth generation (5G) communications are expected to connect more devices to each other efficiently with larger amounts of data and faster data transfer rates, as compared to conventional long-term evolution (LTE) communications.

5G communications are developing in the direction of using a frequency band of 24,250 MHz to 52,600 MHz, corresponding to a millimeter wave (mmWave) band, and a frequency band of 450 MHz to 6,000 MHz, corresponding to a sub-6 GHz band.

Each of the n77 band (3,300 MHz to 4,200 MHz), the n78 band (3,300 MHz to 3,800 MHz), and the n79 band (4,400 MHz to 5,000 MHz), is defined as one from among the sub-6 GHz operating bands. Also, the n77 band (3,300 MHz to 4,200 MHz), the n78 band (3,300 MHz to 3,800 MHz), and the n79 band (4,400 MHz to 5,000 MHz) are expected to be used as main bands, due to the advantages for these bands of having wide bandwidths.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a frontend module, includes a first filter having a passband of a first frequency band, a second filter having a passband of a second frequency band, the second frequency band being higher than the first frequency band, a third filter having a passband of a third frequency and, the third frequency band being higher than the second frequency band, and a sub-filter, connected to the second filter, configured to provide attenuation characteristics for the first frequency band, wherein the second filter includes a plurality of parallel LC resonance circuits arranged between a ground and different nodes, from among a plurality of nodes between a first terminal and a second terminal, wherein an inductor is connected to a portion of the plurality of parallel LC resonance circuits.

The inductor may be configured to provide attenuation characteristics for the third frequency band.

The inductor may be disposed between the portion of the plurality of parallel LC resonance circuits and the ground.

The second filter may include a plurality of inductors, and each of the plurality of inductors may be connected to a different parallel LC resonance circuit of the plurality of parallel LC resonance circuits.

The second filter may include a plurality of capacitors, and each of the plurality of parallel LC resonance circuits may be arranged between a ground and a different node between the plurality of capacitors.

The first frequency band may be a band of 3.3 GHz to 4.2 GHz, the second frequency band may be a band of 4.4 GHz to 5.0 GHz, and the third frequency band may be a band of 5.15 GHz to 5.95 GHz.

The sub-filter may have a stop band of 4.0 GHz to 4.2 GHz.

The first filter, the second filter, and the third filter may be connected to an antenna terminal.

In another general aspect, a frontend module includes first filter having a passband of a first frequency band, a second filter having a passband of a second frequency band, the second frequency band being higher than the first frequency band, a third filter having a passband of a third frequency band, the third frequency band being higher than the second frequency band, and a sub-filter, connected to the second filter, configured to provide attenuation characteristics for the first frequency band, wherein the second filter includes a plurality of series LC resonance circuits arranged between a first terminal and a second terminal, wherein a capacitor is connected to a portion of the plurality of series LC resonance circuits.

The capacitor may be configured to provide attenuation characteristics for the first frequency band.

The capacitor may be connected to the portion of the plurality of series LC resonance circuits in parallel.

The second filter may include a plurality of capacitors, and each of the plurality of capacitors may be connected to a different series LC resonance circuits of the plurality of series LC resonance circuits.

The second filter may include a plurality of inductors, and each of the plurality of series LC resonance circuits may be disposed between the plurality of inductors.

The first frequency band may be a band of 3.3 GHz to 4.2 GHz, the second frequency band may be a band of 4.4 GHz to 5.0 GHz, and the third frequency band may be a band of 5.15 GHz to 5.95 GHz.

The sub-filter may have a stop band of 5.15 GHz to 5.35 GHz.

The first filter, the second filter, and the third filter may be connected to an antenna terminal.

According to another general aspect, a frontend module includes a first filter having a passband of a first frequency band, a second filter having a passband of a second frequency band, the second frequency band being higher than the first frequency band, a third filter having a passband of a third frequency band, the third frequency band being higher than the second frequency band, and a sub-filter, connected to the second filter, configured to provide attenuation characteristics for the first frequency band, wherein the second filter includes a plurality of LC resonance circuits, and a passive element connected to the plurality of LC resonance circuits configured to provide attenuation characteristics for the third frequency band.

The LC resonance circuits may be parallel LC resonance circuits and the passive element may be an inductor.

The LC resonance circuits may be series LC resonance circuits and the passive element may be a capacitor.

The first filter, the second filter, and the third filter may be connected to an antenna terminal.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
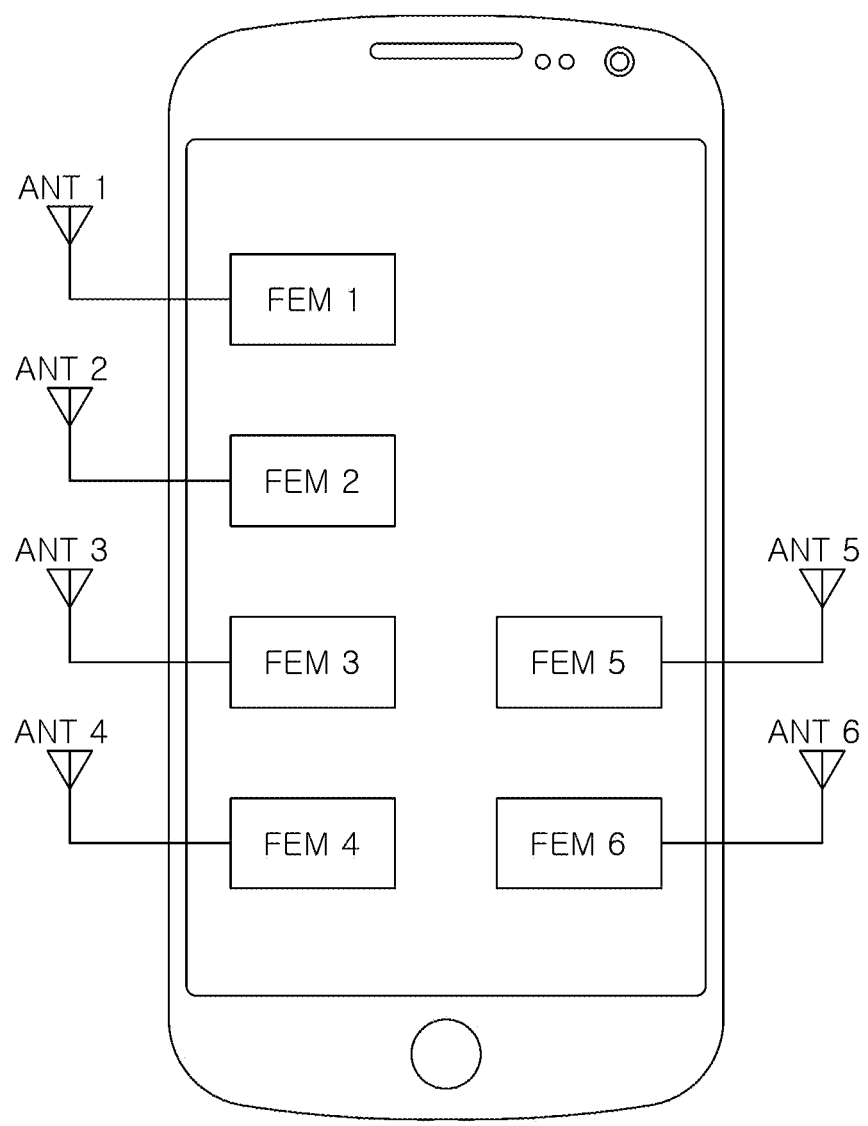
FIG. 1 is a block diagram illustrating a mobile device on which a frontend module according to an example is mounted.

The following detailed description of the present disclosure refers to the accompanying drawings, which illustrate, as an example, specific embodiments in which the present disclosure may be practiced. These embodiments may be described in sufficient detail to enable those skilled in the art to practice the present disclosure. It should be understood that the various embodiments of the present disclosure are different, but do not need to be mutually exclusive. For example, certain shapes, structures, and characteristics described herein may be implemented in other embodiments without departing from the spirit and scope of the present disclosure in connection with an embodiment. It should be also understood that position or arrangement of the individual components within each disclosed embodiment may be varied without departing from the spirit and scope of the present disclosure. The following detailed description is, therefore, not to be taken in a limiting sense, and the scope of the present disclosure is limited only by the appended claims, along with the full scope of equivalents to which such claims are entitled, if properly explained. In the drawings, like reference numerals refer to the same or similar functions throughout the several views.

Hereinafter, examples will be described in detail with reference to the accompanying drawings so that those skilled in the art may easily carry out the examples.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

An aspect of the present examples is to provide a frontend module capable of ensuring sufficient attenuation characteristics for neighboring bands.

FIG. 1 is a block diagram illustrating a mobile device on which a frontend module according to an example is mounted.

Referring to the example of FIG. 1, a mobile device 1 according to an example may include a plurality of antennas ANT1 to ANT6, and a plurality of frontend modules FEM1 to FEM6, respectively connected to different antennas from among the plurality of antennas ANT1 to ANT6.

The mobile device 1 may perform a plurality of standard wireless communications tasks such as cellular (Long-Term Evolution (LTE)/Wideband Code Division Multiply Access (WCDMA)/Global System for Mobile (GSM)) communications, Wi-Fi communications of 2.4 GHz and 5 GHz bands, Bluetooth communications, and other similar wireless communications. The plurality of antennas ANT1 to ANT6 and the plurality of frontend modules FEM1 to FEM6, included in the mobile device, may support the plurality of standard wireless communications, such as those discussed above.

A Multi-Input/Multi-Output (MIMO) system may be applied for use in the mobile device 1. MIMO may be a technique for increasing a bandwidth of the mobile device 1 in proportion to the number of antennas. When the number N of antennas is used, N times of a frequency efficiency may be obtained, as compared to when using a single antenna. Due to the slimming and miniaturization aspects of mobile devices, there may be a limitation with respect to a space in which the antenna is mounted. There may also be physical limitations in further implementing a plurality of antennas in a terminal under a condition in which the antennas, used in the system according to alternative technologies, are provided.

Therefore, a frontend module, connected to any one of the antennas, is desired to be able to support a plurality of standard wireless communications techniques, to be able to reduce the number of antennas mounted on the mobile device 1.

Figure 2:
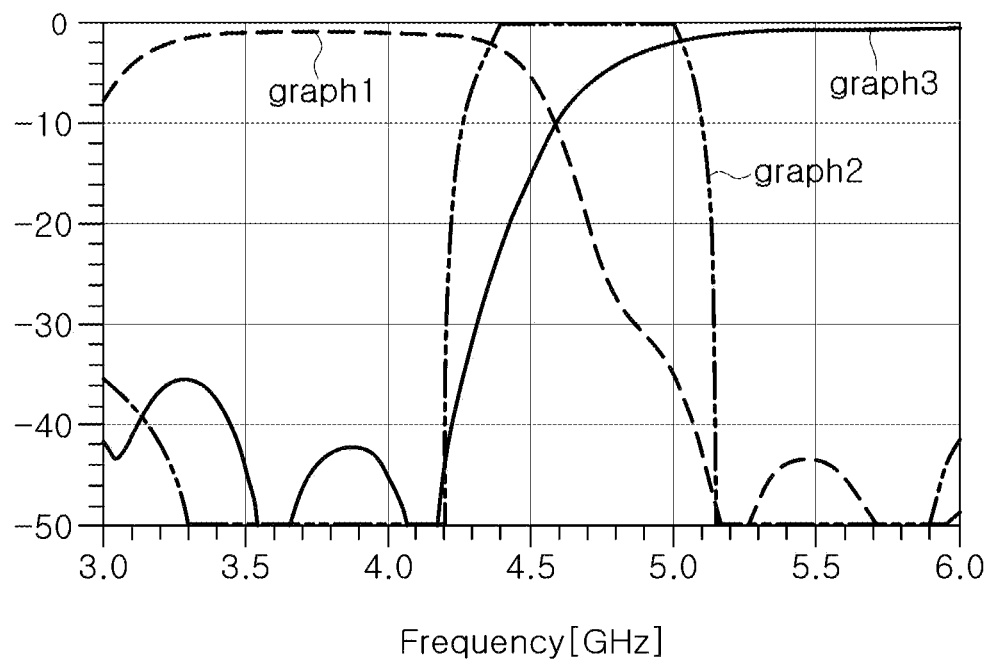
FIG. 2 illustrates a frequency response of filters required to simultaneously support a 3.3 GHz to 4.2 GHz band (an n77 band), a 4.4 GHz to 5.0 GHz band (an n79 band), and a 5.15 GHz to 5.95 GHz band (a 5 GHz Wi-Fi band).

FIG. 2 illustrates a frequency response of filters required to simultaneously support a 3.3 GHz to 4.2 GHz band (an n77 band), a 4.4 GHz to 5.0 GHz band (an n79 band), and a 5.15 GHz to 5.95 GHz band (a 5 GHz Wi-Fi band).

In the example of FIG. 2, it is assumed that a first graph, or graph 1, represents a frequency response of filter A supporting the 3.3 GHz to 4.2 GHz band (the n77 band), a second graph, or graph 2, represents a frequency response of filter B supporting the 4.4 GHz to 5.0 GHz band (the n79 band), and a third graph, or graph 3, represents a frequency response of filter C supporting the 5.15 GHz to 5.95 GHz band (the 5 GHz Wi-Fi band).

The 4.4 GHz to 5.0 GHz band (the n79 band) may have a band gap of 200 MHz from the 3.3 GHz to 4.2 GHz band (the n77 band), and a band gap of only 150 MHz from the 5.15 GHz to 5.95 GHz band (the 5 GHz Wi-Fi band).

Therefore, the filter A supporting the 3.3 GHz to 4.2 GHz band (the n77 band), the filter B supporting the 4.4 GHz to 5.0 GHz band (the n79 band), and the filter C supporting the 5.15 GHz to 5.95 GHz band (the 5 GHz Wi-Fi band) may have sufficient attenuation characteristics with respect to each other, such that they may be able to use a method from methods such as carrier aggregation (CA), LTE in unlicensed spectrum (LTE-U), Licensed Assisted Access (LAA), or another, related method, and such a method may be used in one or more of the 3.3 GHz to 4.2 GHz band (the n77 band), the 4.4 GHz to 5.0 GHz band (the n79 band), and the 5.15 GHz to 5.95 GHz band (the 5 GHz Wi-Fi band).

Although a Bulk Acoustic Wave (BAW) filter has excellent attenuation characteristics, such a BAW filter may not be easily applied to applications in fifth-generation (5G) communications, requiring broadband frequency characteristics, because it is difficult to use such a BAW to form a relatively wide passband. Therefore, in order to satisfy the broadband frequency characteristics required in 5G communications, the filters may be provided as an LC filter, implemented by using a combination of a capacitor and an inductor. Throughout this disclosure, capacitors and inductors are examples of passive elements, along with resistors.

Figure 3:
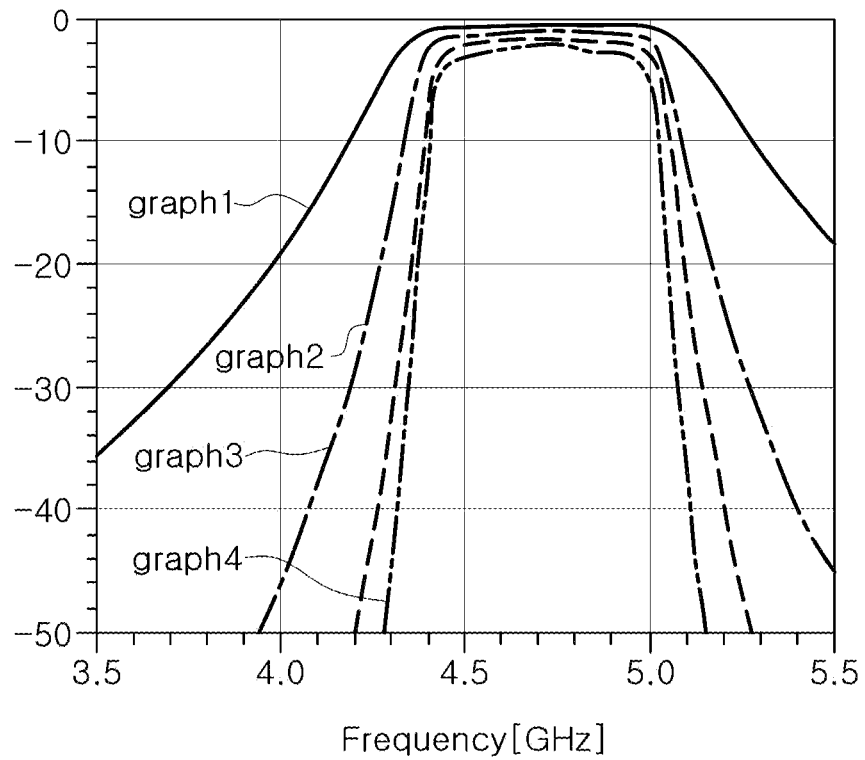
FIG. 3 illustrates a frequency response of a 4.4 GHz to 5.0 GHz band (an n79 band) implemented with a Chebyshev filter.

FIG. 3 illustrates a frequency response of a 4.4 GHz to 5.0 GHz band (an n79 band) implemented by using a Chebyshev filter. Such a Chebyshev filter may be an example of the LC filter, and may correspond to a filter composed of a combination of LC resonators. Chebyshev filters have the property that they minimize the error between the idealized and the actual filter characteristic over the range of the filter.

In the example of FIG. 3, a first graph, or graph 1, represents a frequency response of a third order Chebyshev filter, a second graph, or graph 2, represents a frequency response of a fifth order Chebyshev filter, a third graph, or graph 3, represents a frequency response of a seventh Chebyshev filter, and a fourth graph, or graph 4, represents a frequency response of a ninth order Chebyshev filter.

Referring to the example of FIG. 3, as the order of the Chebyshev filter increases, the attenuation characteristics of the Chebyshev filter may improve at 4.2 GHz and 5.150 GHz, but insertion loss of the Chebyshev filter may deteriorate in the 4.4 GHz to 5.0 GHz band (the n79 band). With respect to insertion loss, the fifth order Chebyshev filter may be more suitable for implementation of the 4.4 GHz to 5.0 GHz band (the n79 band). With respect to attenuation characteristics, the ninth order Chebyshev filter may be more suitable for implementation of the 4.4 GHz to 5.0 GHz band (the n79 band). For example, the Chebyshev filter composed only of the combination of LC resonators may present an issue that it does not simultaneously satisfy the pass characteristics relevant for the broadband and the attenuation characteristics relevant for the neighboring bands.

Figure 4A:
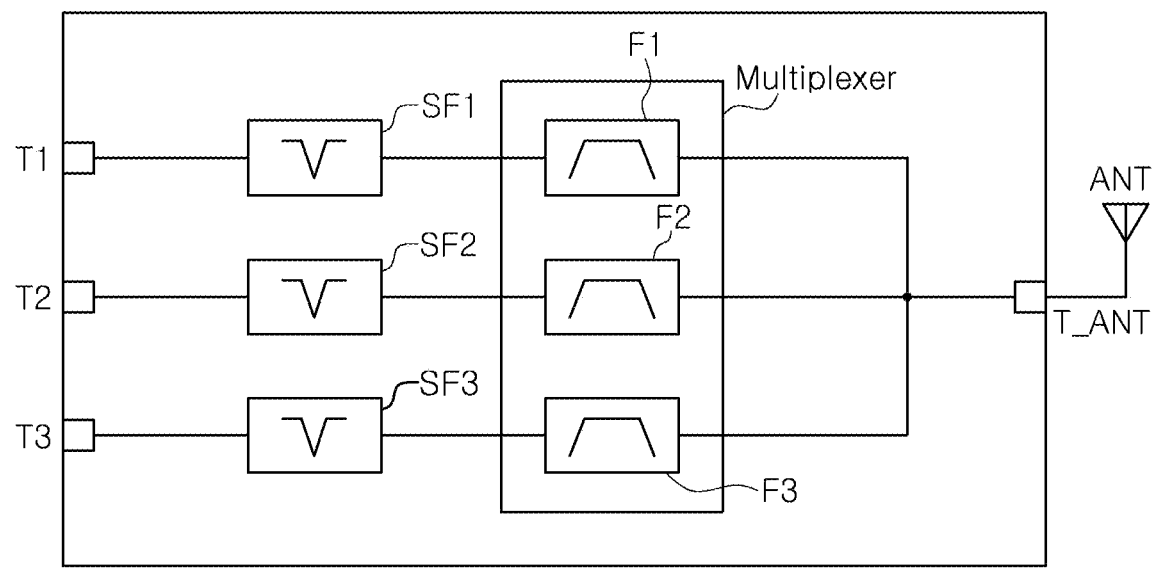
FIGS. 4A and 4B are block diagrams of frontend modules according to various examples.
Figure 4B:
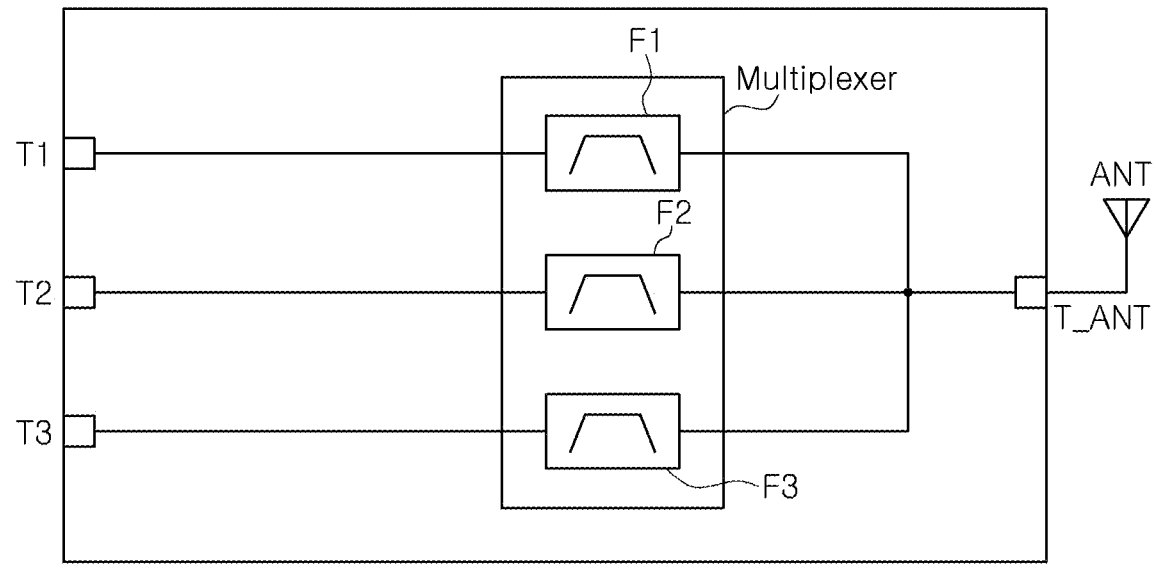

FIGS. 4A and 4B are block diagrams of frontend modules according to various examples.

Referring to the example of FIG. 4A, a frontend module according to an example may include a multiplexer including a first filter F1, a second filter F2, and a third filter F3, connected to an antenna terminal T_ANT, and a first sub-filter SF1, a second sub-filter SF2, and a third sub-filter SF3. Referring to the example of FIG. 4B, the frontend module may be configured to have a form in which the first sub-filter SF1, the second sub-filter SF2, and the third sub-filter SF3 are omitted, as an alternative example.

Subsequently, for ease of explanation, it is assumed that a frontend module according to the present examples includes the first sub-filter SF1, the second sub-filter SF2, and the third sub-filter SF3, as discussed, further, above.

For example, the first filter F1 may be disposed between the antenna terminal T_ANT and the first sub-filter SF1. In such an example, one end of the first filter F1 may be connected to the antenna terminal T_ANT, and the other end of the first filter F1 may be connected to the first sub-filter SF1. Also, an antenna ANT may be connected to the antenna terminal T_ANT.

The first filter F1 may support cellular communications in a first frequency band, specifically, the 3.3 GHz to 4.2 GHz band (the n77 band), from among the sub-6 GHz bands. According to an example, the first filter F1 may support cellular communications in the 3.3 GHz to 3.8 GHz band (the n78 band).

The first filter F1 may operate as a band-pass filter. For example, the first filter F1 may include a band-pass filter having a passband of the 3.3 GHz to 4.2 GHz band. Such a band-pass filter may have a lower limit frequency of 3.3 GHz and an upper limit frequency of 4.2 GHz. According to another example, the first filter F1 may include a band-pass filter having a passband of the 3.3 GHz to 3.8 GHz band. In such an example, the band-pass filter has a lower limit frequency of 3.3 GHz and an upper limit frequency of 3.8 GHz.

The first filter F1 may be composed of an LC filter. For example, the LC filter of the first filter F1 may be implemented by using a structure of a Chebyshev filter.

In an example, the first sub-filter SF1 may be disposed between the first filter F1 and a first terminal T1. In such an example, one end of the first sub-filter SF1 is connected to the first filter F1, and the other end of the first sub-filter SF1 is connected to the first terminal T1.

Additionally, the first sub-filter SF1 may operate as a band-stop filter. For example, the first sub-filter SF1 may operate as a band-stop filter having a lower limit frequency of 4.4 GHz and an upper limit frequency of 4.6 GHz. For example, the first sub-filter SF1 may be composed of a Surface Acoustic Wave (SAW) filter or a BAW filter having relatively high attenuation characteristics. However, these are only examples, and other types of filters with appropriate attenuation characteristics may be used, as appropriate, in other examples.

Also, the first sub-filter SF1 may be disposed in a signal path between the first terminal T1 and the antenna terminal T_ANT. Doing so may sufficiently ensure the attenuation characteristics of the first filter F1 for the 4.4 GHz to 5.0 GHz band (the n79 band).

According to an example, an inductor may be disposed in the signal path between the first terminal T1 and the antenna terminal T_ANT. Such an inductor may provide a low-pass characteristic, so as to allow an impedance of the 4.4 GHz to 5.0 GHz band (the n79 band) to match an impedance of the 3.3 GHz to 4.2 GHz band (the n77 band), which is located in a relatively low frequency band.

In an example, the second filter F2 may be disposed between the antenna terminal T_ANT and the second sub-filter SF2. In such an example, one end of the second filter F2 may be connected to the antenna terminal T_ANT, and the other end of the second filter F2 may be connected to the second sub-filter SF2.

The second filter F2 may support cellular communications in a second frequency band. Specifically, the second filter F2 may support the 4.4 GHz to 5.0 GHz band (the n79 band), from among the sub-6 GHz bands.

The second filter F2 may operate as a band-pass filter. For example, the second filter F2 may include a band-pass filter having a passband of the 4.4 GHz to 5.0 GHz band. Such a filter has a lower limit frequency of 4.4 GHz and an upper limit frequency of 5.0 GHz.

Figure 5A:
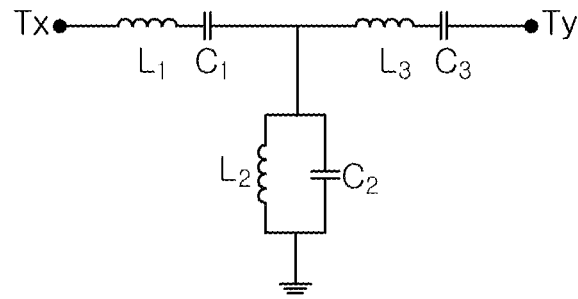
FIGS. 5A to 5C illustrate a process of deriving a second filter according to an example.
Figure 5B:
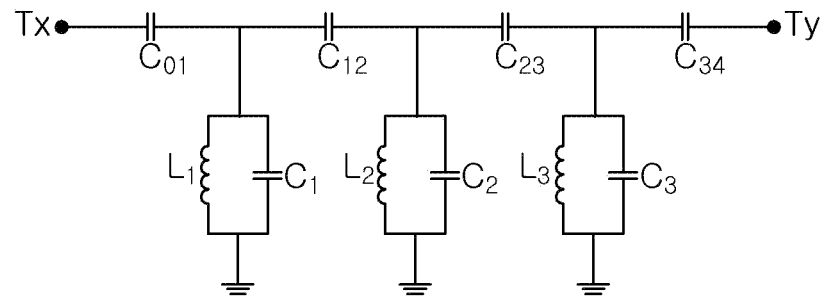
Figure 5C:
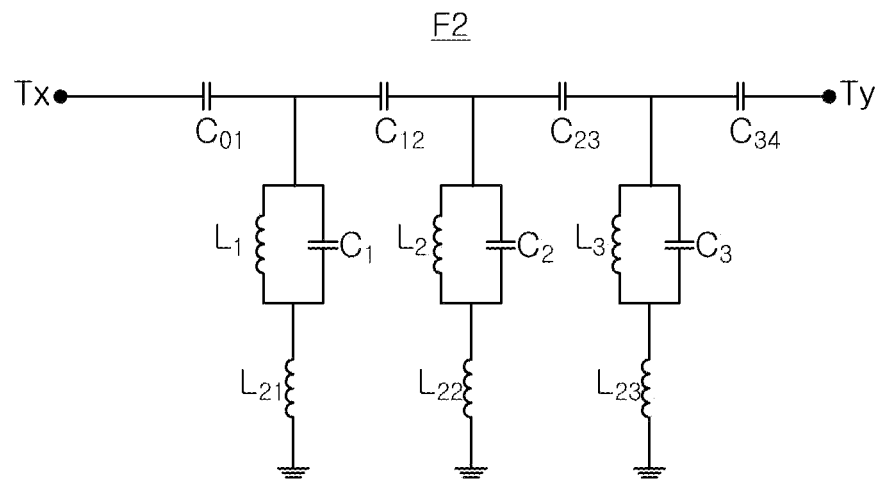

FIGS. 5A to 5C illustrate a process of deriving a second filter according to an example.

FIG. 5A illustrates an example of a circuit diagram of a Chebyshev filter in which resonance circuits are arranged in a T-shape.

The Chebyshev filter in the example of FIG. 5A may have a predetermined transfer-function. The Chebyshev filter in the example of FIG. 5A may include a first series resonance circuit including a first capacitor C1 and a first inductor L1 connected to each other in series, a parallel resonance circuit including a second capacitor C2 and a second inductor L2 connected to each other in parallel, and a second series resonance circuit including a third capacitor C3 and a third inductor L3 connected to each other in series.

In such an example, the first series resonance circuit and the second series resonance circuit may be arranged between a first terminal Tx and a second terminal Ty. The parallel resonance circuit may be disposed between a ground and a node, located between the first series resonance circuit and the second series resonance circuit.

FIG. 5B illustrates an example of a circuit diagram in which a J-inverter technique is applied to the Chebyshev filter in the example of FIG. 5A.

Referring to the example of FIG. 5B, a filter in the example of FIG. 5B may include a capacitor C01, a capacitor C12, a capacitor C23, and a capacitor C34, where these capacitors are arranged between the terminal Tx and the terminal Ty in series.

The filter in the example of FIG. 5B may include a first capacitor C1 and a first inductor L1 arranged between a ground and a node, located between the capacitor C01 and the capacitor C12, and connected to each other in parallel, a second capacitor C2 and a second inductor L2 arranged between a ground and a node, located between the capacitor C12 and the capacitor C23, and connected to each other in parallel, and a third capacitor C3 and a third inductor L3 arranged between a ground and a node, located between the capacitor C23 and the capacitor C34, and connected to each other in parallel.

The filter in the example of FIG. 5B may be derived by applying a J-inverter technique to the filter in the example of FIG. 5A.

The first capacitor C1 and the first inductor L1 connected to each other in series, and the third capacitor C3 and the third inductor L3 connected to each other in series, as illustrated in the example of FIG. 5A, may be converted into a form connected in parallel, so as to be arranged between a ground and different nodes of the terminal Tx and the terminal Ty, by applying the J-inverter technique to the filter in the example of FIG. 5A.

A capacitor C01, a capacitor C12, a capacitor C23, and a capacitor C34, having high-pass filter characteristics, may be additionally arranged to satisfy the transfer-function of the Chebyshev filter illustrated in part of the example of FIG. 5A.

Figure 6A:
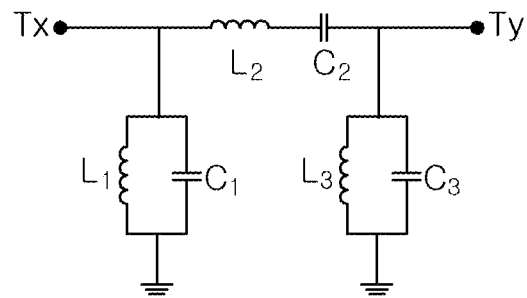
FIGS. 6A to 6C illustrate a process of deriving a second filter according to an example.
Figure 6B:
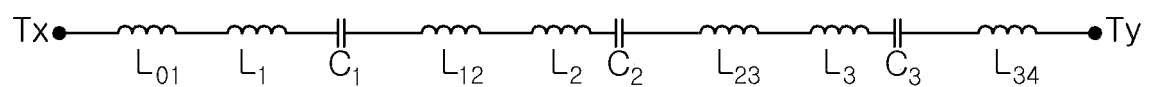
Figure 6C:
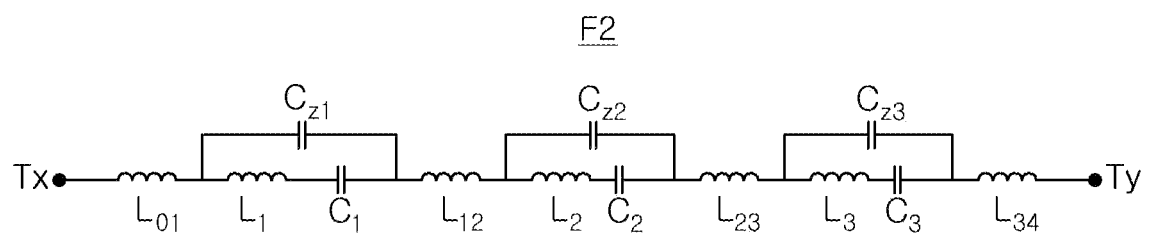

FIGS. 6A to 6C illustrate a process of deriving a second filter according to an example.

FIG. 6A illustrates an example of a Chebyshev filter in which resonance circuits are arranged in a π-shape.

The Chebyshev filter in the example of FIG. 6A may have a predetermined transfer-function.

The Chebyshev filter in the example of FIG. 6A may include a first parallel resonance circuit, including a first capacitor C1 and a first inductor L1 connected to each other in parallel, a series resonance circuit including a second capacitor C2 and a second inductor L2 connected to each other in series, and a second parallel resonance circuit including a third capacitor C3 and a third inductor L3 connected to each other in parallel.

The series resonance circuit may be disposed between a terminal Tx and a terminal Ty, the first parallel resonance circuit may be disposed between a ground and a node located between the terminal Tx and the series resonance circuit, and the second parallel resonance circuit may be disposed between a ground and a node located between the terminal Ty and the series resonance circuit.

FIG. 6B illustrates an example of a circuit diagram in which a K-inverter technique is applied to the Chebyshev filter in the example of FIG. 6A.

Referring to the example of FIG. 6B, a filter in the example of FIG. 6B may include a first capacitor C1 and a first inductor L1 connected to each other in series, a second capacitor C2 and a second inductor L2 connected to each other in series, and a third capacitor C3 and a third inductor L3 connected to each other in series, which are arranged between the terminal Tx and the terminal Ty in sequence.

The filter in the example of FIG. 6B may further include an inductor L01 disposed between the terminal Tx and the first capacitor C1 and the first inductor L1 connected in series, an inductor L12 disposed between the first capacitor C1 and the first inductor L1 connected in series and the second capacitor C2 and the second inductor L2 connected in series, an inductor L23 disposed between the second capacitor C2 and the second inductor L2 connected in series and the third capacitor C3 and the third inductor L3 connected in series, and an inductor L34 disposed between the terminal Ty and the third capacitor C3 and the third inductor L3 connected in series.

The filter in the example of FIG. 6B may be derived by applying the K-inverter technique to the filter in the example of FIG. 6A.

The first capacitor C1 and the first inductor L1 connected to each other in parallel, and the third capacitor C3 and the third inductor L3 connected to each other in parallel, as illustrated in the example of FIG. 6A, may be converted into a form connected in series, to be arranged between the terminal Tx and the terminal Ty, by applying the K-inverter technique to the filter in the example of FIG. 6A.

An inductor L01, an inductor L12, an inductor L23, and an inductor L34, having low-pass filter characteristics, may be additionally arranged to satisfy the transfer-function of the Chebyshev filter, as illustrated in the example of FIG. 6A.

Figure 7:
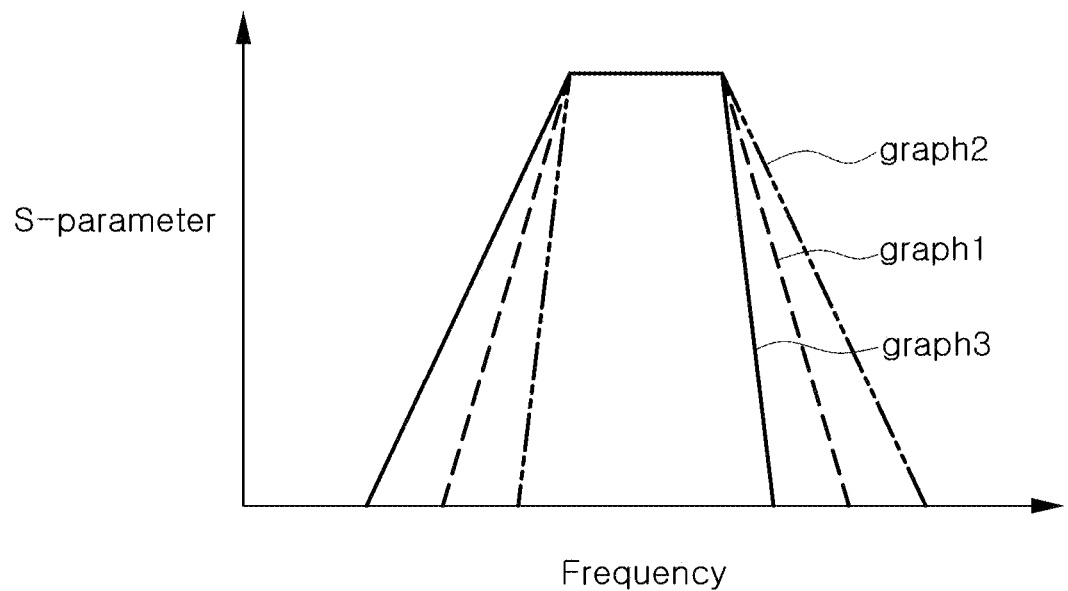
FIG. 7 is a graph illustrating a frequency response of a filter to which a J-inverter technique or a K-inverter technique is applied.

FIG. 7 is a graph illustrating a frequency response of a filter to which a J-inverter technique or a K-inverter technique is applied.

Referring to the example of FIG. 7, a first graph, or graph 1, represents a frequency response of a filter before applying a J-inverter technique or a K-inverter technique, a second graph, or graph 2, represents a frequency response of a filter to which a J-inverter is applied, and a third graph, or graph 3, represents a frequency response of a filter to which a K-inverter is applied.

Referring to the examples of FIGS. 5A and 5B, and the example of FIG. 7, because of the capacitor C01, the capacitor C12, the capacitor C23, and the capacitor C34, which may be additionally arranged in the example of FIG. 5B, in the second graph, or graph 2, the low frequency band has additionally improved attenuation characteristics and the high frequency band has additionally deteriorated attenuation characteristics, as compared to the first graph, or graph 1.

Referring to the examples of FIGS. 6A and 6B, and the example of FIG. 7, because of the inductor L01, the inductor L12, the inductor L23, and the inductor L34, which may be additionally arranged as in the example of FIG. 6B, in the third graph, or graph 3, the high frequency band has further improved attenuation characteristics and the low frequency band has further deteriorated attenuation characteristics, as compared to the first graph, or graph 1.

Therefore, it is required to improve the attenuation characteristics that would otherwise deteriorate in the high frequency band by including the capacitor C01, the capacitor C12, the capacitor C23, and the capacitor C34 as in the example of FIG. 5B, and the attenuation characteristics that would otherwise deteriorate in the low frequency band by the inductor L01, the inductor L12, the inductor L23, and the inductor L34 as in the example of FIG. 6B.

FIG. 5C is a circuit diagram illustrating a second filter F2 according to an example.

The second filter F2 according to an example in the example of FIG. 5C may further include an inductor L21, an inductor L22, and an inductor L23, as compared to the filter in the example FIG. 5B.

Referring to the example of FIG. 5C, the second filter F2 according to an example may include a first parallel LC resonance circuit, a second parallel LC resonance circuit, a third parallel LC resonance circuit, the inductor L21, the inductor L22, the inductor L23, a capacitor C01, a capacitor C12, a capacitor C23, and a capacitor C34.

In such an example, the first parallel LC resonance circuit may include a first capacitor C1 and a first inductor L1 connected to each other in parallel, the second parallel LC resonance circuit may include a second capacitor C2 and a second inductor L2 connected to each other in parallel, and the third parallel LC resonance circuit may include a third capacitor C3 and a third inductor L3 connected to each other in parallel.

The first parallel LC resonance circuit, the second parallel LC resonance circuit, and the third parallel LC resonance circuit may be disposed between a ground and different nodes, from among a plurality of nodes between a first terminal Tx and a second terminal Ty. Thus, each of the first parallel LC resonance circuit, the second parallel LC resonance circuit, and the third parallel LC resonance circuit may be disposed between a ground and a node of different nodes located between the capacitor C01, the capacitor C12, the capacitor C23, and the capacitor C34.

Also, the inductor L21 may be disposed between the first parallel LC resonance circuit and a ground, the inductor L22 may be disposed between the second parallel LC resonance circuit and a ground, and the inductor L23 may be disposed between the third parallel LC resonance circuit and a ground.

In the example of FIG. 5C, although an inductor is illustrated as being connected to each of the first parallel LC resonance circuit, the second parallel LC resonance circuit, and the third parallel LC resonance circuit, the inductor may be connected to only one parallel LC resonance circuit selected from among the first parallel LC resonance circuit, the second parallel LC resonance circuit, and the third parallel LC resonance circuit, according to an example. Further, according to an example, two parallel LC resonance circuits among the first parallel LC resonance circuit, the second parallel LC resonance circuit, and the third parallel LC resonance circuit may be connected to a ground via a single inductor.

The inductor L21, the inductor L22, and the inductor L23, respectively connected to the first parallel LC resonance circuit, the second parallel LC resonance circuit, and the third parallel LC resonance circuit, may form an additional attenuation region, to improve the attenuation characteristics deteriorated in the high frequency band, because of the capacitor C01, the capacitor C12, the capacitor C23, and the capacitor C34, which may be additionally disposed at the time of applying the J-inverter technique.

The second filter F2 may secure sufficient attenuation characteristics for the 5.15 GHz to 5.95 GHz band (the 5 GHz Wi-Fi band) by an attenuation region formed by the presence of inductor L21, the inductor L22, and the inductor L23.

FIG. 6C is a circuit diagram illustrating a second filter F2 according to another example.

Referring to FIG. 6C, the second filter F2 according to an embodiment in FIG. 6C may further include a capacitor Cz1, a capacitor Cz2, and a capacitor Cz3, in addition to the second filter F2 according to an embodiment in FIG. 6B.

Referring to the example of FIG. 6C, the second filter F2 according to an example may include a first series LC resonance circuit, a second series LC resonance circuit, a third series LC resonance circuit, the capacitor Cz1, the capacitor Cz2, the capacitor Cz3, an inductor L01, an inductor L12, an inductor L23, and an inductor L34.

For example, the first series LC resonance circuit may include a first capacitor C1 and a first inductor L1 connected to each other in series, the second series LC resonance circuit may include a second capacitor C2 and a second inductor L2 connected to each other in series, and the third series LC resonance circuit may include a third capacitor C3 and a third inductor L3 connected to each other in series.

The first series LC resonance circuit, the second series LC resonance circuit, and the third series LC resonance circuit may be arranged between a first terminal Tx and a second terminal Ty. Also, the first series LC resonance circuit, the second series LC resonance circuit, and the third series LC resonance circuit may be arranged between the inductor L01, the inductor L12, the inductor L23, and the inductor L34.

The capacitor Cz1 may be connected to the first series LC resonance circuit in parallel, the capacitor Cz2 may be connected to the second series LC resonance circuit in parallel, and the capacitor Cz3 may be connected to the third series LC resonance circuit in parallel.

In the example of FIG. 6C, although a capacitor is illustrated as being connected to each of the first series LC resonance circuit, the second series LC resonance circuit, and the third series LC resonance circuit, in other examples, the capacitor may be connected to only one series LC resonance circuit selected from among the first series LC resonance circuit, the second series LC resonance circuit, and the third series LC resonance circuit, according to an example. The capacitor Cz1, the capacitor Cz2, and the capacitor Cz3, respectively connected to the first series LC resonance circuit, the second series LC resonance circuit, and the third series LC resonance circuit, may form an additional attenuation region, to improve the attenuation characteristics otherwise deteriorated in the low frequency band, by the presence of the inductor L01, the inductor L12, the inductor L23, and the inductor L34.

The second filter F2 may secure sufficient attenuation characteristics for the 3.3 GHz to 4.2 GHz band (the n77 band) by including an attenuation region formed by the presence of the capacitor Cz1, the capacitor Cz2, and the capacitor Cz3.

Referring again to the example of FIG. 4A, the second sub-filter SF2 may be disposed between the second filter F2 and a second terminal T2. One end of the second sub-filter SF2 may be connected to the second filter F2, and the other end of the second sub-filter SF2 may be connected to the second terminal T2.

For example, the second sub-filter SF2 may act as a band-stop filter. The second sub-filter SF2 may be composed of a SAW filter or a BAW filter having relatively high attenuation characteristics. The second sub-filter SF2 may be disposed in a signal path between the second terminal T2 and the antenna terminal T_ANT, in order to compensate for the attenuation characteristics of the second filter F2.

For example, when the second filter F2 is configured according to an example as per FIG. 5C, the second sub-filter SF2 may include a band stop filter having a stop band of a 4.0 GHz to 4.2 GHz band. For example, such a filter may have a lower frequency of 4.0 GHz, and an upper limit frequency of 4.2 GHz. The second sub-filter SF2 may sufficiently compensate for the attenuation characteristics of the second filter F2 for the 3.3 GHz to 4.2 GHz band (the n77 band). Therefore, the second filter F2 according to an example as per FIG. 5C may secure sufficient attenuation characteristics for a 5.15 GHz to 5.95 GHz band by an attenuation region formed by the inductor L21, the inductor L22, and the inductor L23, and may secure sufficient attenuation characteristics for the 3.3 GHz to 4.2 GHz band (the n77 band) by using the stop band of the 4.0 GHz to 4.2 GHz band of the second sub-filter SF2.

As another example, when the second filter F2 is configured according to an example as per FIG. 6C, the second sub-filter SF2 may include a band stop filter having a stop band of a 5.15 GHz to 5.35 GHz band. Here, the second sub-filter SF2 has a lower frequency of 5.15 GHz, and an upper limit frequency of 5.35 GHz. Thus, the second sub-filter SF2 may sufficiently compensate for the attenuation characteristics of the second filter F2 with respect to the 5.15 GHz to 5.95 GHz band (the 5 GHz Wi-Fi band).

As a result, the second filter F2 according to the example of FIG. 6C may secure sufficient attenuation characteristics for the 3.3 GHz to 4.2 GHz band (the n77 band) by using an attenuation region formed by the capacitor Cz1, the capacitor Cz2, and the capacitor Cz3. The second filter F2 may secure sufficient attenuation characteristics for the 5.15 GHz to 5.95 GHz band (the 5 GHz Wi-Fi band) by using the stop band of the 5.15 GHz to 5.35 GHz band of the second sub-filter SF2.

According to an example, the second filter F2 may be configured as illustrated in the examples of FIG. 5C and FIG. 6C, in order to reduce the number of band stop filters, used for providing the attenuation characteristics for neighboring bands, to one.

The third filter F3 may be disposed between the antenna terminal T_ANT and the third sub-filter SF3. One end of the third filter F3 may be connected to the antenna terminal T_ANT, and the other end of the third filter F3 may be connected to the third sub-filter SF3.

The third filter F3 may support Wi-Fi communications in the third frequency band, specifically, the 5 GHz band. As an example, the third filter F3 may support Wi-Fi communications in the 5.15 GHz to 5.95 GHz band.

In such an example, the third filter F3 may operate as a band-pass filter. For example, the third filter F3 may include a band-pass filter having a passband of the 5.15 GHz to 5.95 GHz band. Such a third filter F3 may have a lower limit frequency of 5.15 GHz and an upper limit frequency of 5.95 GHz.

The third filter F3 may also be composed of an LC filter. For example, the LC filter of the third filter F3 may be implemented by using a structure of a Chebyshev filter.

The third sub-filter SF3 may be disposed between the third filter F3 and a third terminal T3. One end of the third sub-filter SF3 may be connected to the third filter F3. The other end of the third filter F3 may be connected to the third terminal T3.

The third sub-filter SF3 may operate as a band-stop filter. For example, the third sub-filter SF3 may operate as a band-stop filter having a lower limit frequency of 4.8 GHz and an upper limit frequency of 5.0 GHz. Such a third sub-filter SF3 may be composed of a SAW filter or a BAW filter having relatively high attenuation characteristics, as discussed further, above.

The third sub-filter SF3 may be disposed in a signal path between the third terminal T3 and the antenna terminal T_ANT. Doing so ensures sufficient attenuation characteristics for the third filter F3 with respect to the 4.4 GHz to 5.0 GHz band. According to an example, a capacitor may be disposed in the signal path between the third terminal T3 and the antenna terminal T_ANT. Such a capacitor may provide a high-pass characteristic, which allows an impedance of the 4.4 GHz to 5.0 GHz band (the n79 band) to match an impedance of the 5.15 GHz to 5.95 GHz band (the Wi-Fi 5 GHz band), which is located in a relatively high frequency band.

Figure 8:
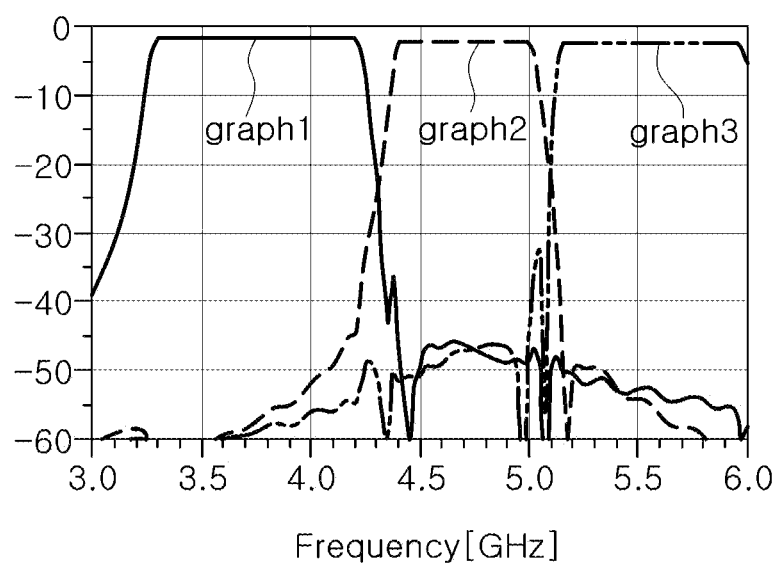
FIG. 8 illustrates frequency responses by first to third filters according to an example.
Figure 9:
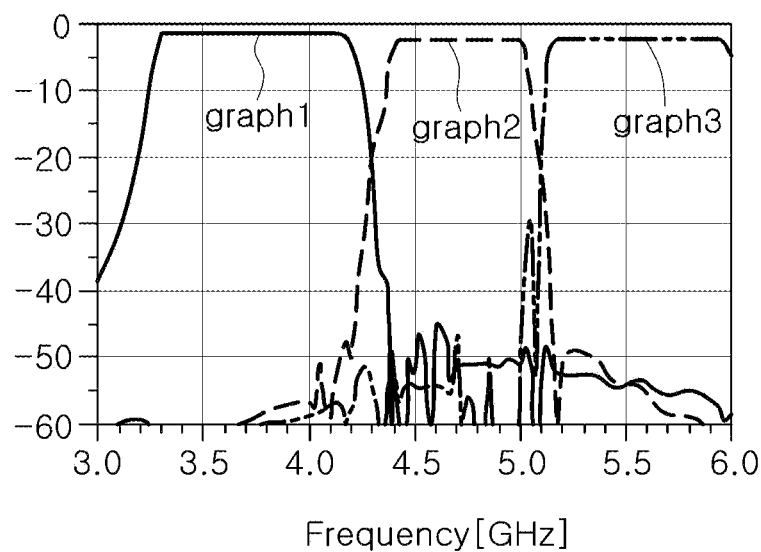
FIG. 9 illustrates frequency responses by first to third filters and first to third sub-filters according to an example.

FIG. 8 illustrates frequency responses by first to third filters according to an example. FIG. 9 illustrates frequency responses by first to third filters and first to third sub-filters according to an example.

Referring to the example of FIG. 8, even when first to third filters are implemented by using a Chebyshev filter, such that a passband has a relatively broad bandwidth of 600 MHz or more, excellent insertion loss characteristics and reflection loss characteristics may still be realized.

Referring to the example of FIG. 9, each of first to third sub-filters may be connected to each first to third filters, such that the 3.3 GHz to 4.2 GHz band (the n77 band), the 4.4 GHz to 5.0 GHz band (the n79 band), and the 5.15 GHz to 5.95 GHz band (the 5 GHz Wi-Fi band) may secure sufficient attenuation characteristics with respect to each other.

Figure 10:
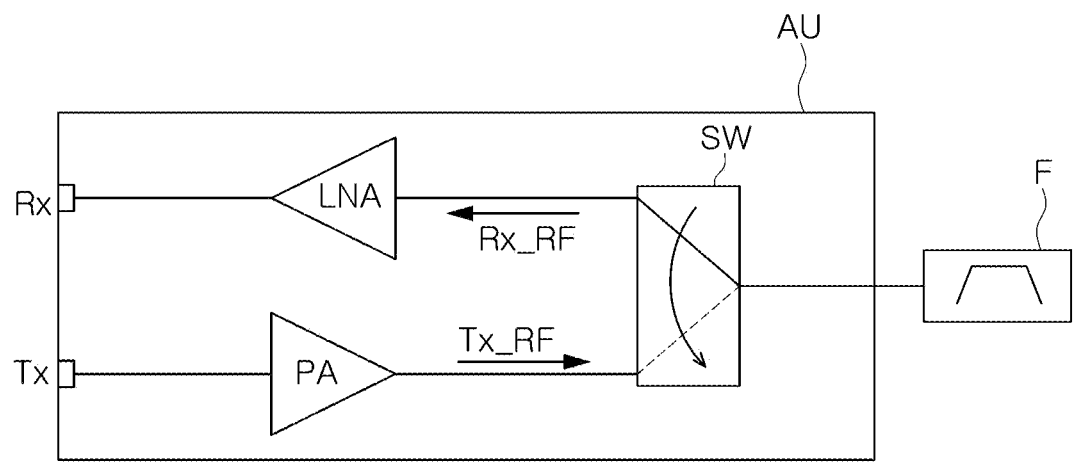
FIG. 10 is a block diagram illustrating an example of an amplifier connected to a filter according to an example.

FIG. 10 is a block diagram illustrating an example of an amplifier connected to a filter according to an example.

In the example of FIG. 10, it may be understood that a filter F may correspond to any one of the first filter F1, the second filter F2, and the third filter F3 of the example of FIG. 4A, or may correspond to any one of the sub-filter SF1, the second sub-filter SF2, and the third sub-filter SF3 of the example of FIG. 4B. It may also be understood that a receiving terminal Rx and a transmitting terminal Tx may be included in any one of a first terminal T1 to a fourth terminal T4 according to various examples. For example, the first terminal T1 may include the receiving terminal Rx and the transmitting terminal Tx.

Additionally, an amplifying unit AU may include a switch SW, a low noise amplifier LNA, and a power amplifier PA.

Referring to the example of FIG. 10, the filter F may be connected to one end of the low noise amplifier LNA and one end of the power amplifier PA through the switch SW. The low noise amplifier LNA may be disposed in a receiving path (Rx_RF) of an RF signal. Accordingly, the power amplifier PA may be disposed in a transmission path (Tx_RF) of the RF signal. The other end of the low noise amplifier LNA may be connected to the receiving terminal Rx, and the other end of the power amplifier PA may be connected to the transmitting terminal Tx.

In the example of FIG. 10, an example is illustrated in which the low noise amplifier LNA is disposed in the receiving path Rx_RF, and the power amplifier PA is disposed in the transmission path Tx_RF. Depending on the necessity of amplification according to the design of an example, the low noise amplifier LNA may be removed from the receiving path Rx_RF, or the power amplifier PA may be removed from the transmission path Tx_RF.

According to an example, the number of antennas employed in a mobile device may be reduced to improve the isolation characteristic of the antenna.

According to an example, sufficient attenuation characteristics for neighboring bands may be ensured.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A frontend module, comprising:
   a first filter having a passband of a first frequency band;
   a second filter having a passband of a second frequency band, the second frequency band being higher than the first frequency band;
   a third filter having a passband of a third frequency band, the third frequency band being higher than the second frequency band; and
   a sub-filter connected to the second filter, and configured to provide attenuation characteristics for one of the first frequency band and the third frequency band,
   wherein the second filter comprises:
     a plurality of parallel LC resonance circuits arranged between a ground and different nodes, from among a plurality of nodes between first and second terminals of the second filter; and
     an inductor disposed between a portion of the plurality of parallel LC resonance circuits and the ground, and
   wherein the second filter is configured to more greatly improve attenuation characteristics of a low frequency band of the second frequency band than attenuation characteristics of a high frequency band of the second frequency band.

2. The frontend module of claim 1, wherein the sub-filter is further configured to provide attenuation characteristics for the first frequency band.

3. The frontend module of claim 1, wherein each of the plurality of parallel LC resonance circuits comprises a resonance inductor and a resonance capacitor connected to the resonance inductor in parallel.

4. The frontend module of claim 1, wherein the inductor is configured as a plurality of inductors, and
   wherein each of the plurality of inductors is connected to a different parallel LC resonance circuit of the plurality of parallel LC resonance circuits in series.

5. The frontend module of claim 1, wherein the second filter comprises a plurality of capacitors, and each of the plurality of parallel LC resonance circuits is arranged between a ground and the different node between the plurality of capacitors.

6. A frontend module, comprising:
   a first filter having a passband of a first frequency band;
   a second filter having a passband of a second frequency band, the second frequency band being higher than the first frequency band;
   a third filter having a passband of a third frequency band, the third frequency band being higher than the second frequency band; and
   a sub-filter connected to the second filter, and configured to provide attenuation characteristics for one of the first frequency band and the third frequency band,
   wherein the second filter comprises:
     a plurality of parallel LC resonance circuits arranged between a ground and different nodes, from among a plurality of nodes between first and second terminals of the second filter; and
     an inductor connected to a portion of the plurality of parallel LC resonance circuits, and
   wherein the second filter is configured to more greatly improve attenuation characteristics of a low frequency band of the second frequency band than attenuation characteristics of a high frequency band of the second frequency band, and
   wherein the sub-filter comprises a surface acoustic wave (SAW) filter or a bulk acoustic wave (BAW) filter.

7. A frontend module, comprising:
   a first filter having a passband of a first frequency band;
   a second filter having a passband of a second frequency band, the second frequency band being higher than the first frequency band;
   a third filter having a passband of a third frequency band, the third frequency band being higher than the second frequency band; and
   a sub-filter connected to the second filter, and configured to provide attenuation characteristics for one of the first frequency band and the third frequency band,
   wherein the second filter comprises:
     a plurality of parallel LC resonance circuits arranged between a ground and different nodes, from among a plurality of nodes between first and second terminals of the second filter; and
     an inductor connected to a portion of the plurality of parallel LC resonance circuits, and
   wherein the second filter is configured to more greatly improve attenuation characteristics of a low frequency band of the second frequency band than attenuation characteristics of a high frequency band of the second frequency band, and wherein the sub-filter has a stop band narrower than each of the first frequency band, the second frequency band and the third frequency band.

8. The frontend module of claim 7, wherein the sub-filter is configured as a second sub-filter,
wherein the stop band is configured as a second stop band, and
wherein the frontend module further comprises:
a first sub-filter connected to the first filter and having a first stop band higher than the first frequency band; and
a third sub-filter connected to the third filter and having a third stop band lower than the third frequency band.

9. The frontend module of claim 7, wherein the first filter, the second filter, and the third filter are connected to an antenna terminal.

10. A frontend module, comprising:
a first filter having a passband of a first frequency band;
a second filter having a passband of a second frequency band, the second frequency band being higher than the first frequency band;
a third filter having a passband of a third frequency band, the third frequency band being higher than the second frequency band; and
a sub-filter connected to the second filter, and configured to provide attenuation characteristics for one of the first frequency band and the third frequency band,
wherein the second filter comprises:
a plurality of series LC resonance circuits arranged in series between first and second terminals of the second filter; and
a capacitor connected to a portion of the plurality of series LC resonance circuits, and
wherein the second filter is configured to more greatly improve attenuation characteristics of a high frequency band of the second frequency band than attenuation characteristics of a low frequency band of the second frequency band.

11. The frontend module of claim 10, wherein the sub-filter is further configured to provide attenuation characteristics for the third frequency band.

12. The frontend module of claim 10, wherein the capacitor is connected to the portion of the plurality of series LC resonance circuits in parallel.

13. The frontend module of claim 10, wherein the capacitor is configured as a plurality of capacitors, and
wherein each of the plurality of capacitors is connected to a different series LC resonance circuit of the plurality of series LC resonance circuits in parallel.

14. The frontend module of claim 10, wherein the second filter comprises a plurality of inductors, and each of the plurality of series LC resonance circuits is disposed between the plurality of inductors.

15. The frontend module of claim 10, wherein each of the plurality of series LC resonance circuits comprises a resonance inductor and a resonance capacitor connected to the resonance inductor in series.

16. The frontend module of claim 10, wherein the sub-filter comprises a surface acoustic wave (SAW) filter or a bulk acoustic wave (BAW) filter.

17. The frontend module of claim 10, wherein the sub-filter has a stop band narrower than each of the first frequency band, the second frequency band and the third frequency band.

18. The frontend module of claim 17, wherein the sub-filter is configured as a second sub-filter,
wherein the stop band is configured as a second stop band, and
wherein the frontend module further comprises:
a first sub-filter connected to the first filter and having a first stop band higher than the first frequency band; and
a third sub-filter connected to the third filter and having a third stop band lower than the third frequency band.

19. The frontend module of claim 10, wherein the first filter, the second filter, and the third filter are connected to an antenna terminal.

* * * * *